US006700076B2

(12) United States Patent
Sun et al.

(10) Patent No.: US 6,700,076 B2
(45) Date of Patent: Mar. 2, 2004

(54) MULTI-LAYER INTERCONNECT MODULE AND METHOD OF INTERCONNECTION

(75) Inventors: Xiao-Peng Sun, Fremont, CA (US); Nanlei Larry Wang, Palo Alto, CA (US)

(73) Assignee: EIC Corporation, Fremont, CA (US)

( * ) Notice: Subject to any disclaimer, the term of this patent is extended or adjusted under 35 U.S.C. 154(b) by 0 days.

(21) Appl. No.: 10/061,546

(22) Filed: Feb. 1, 2002

(65) Prior Publication Data

US 2002/0105083 A1 Aug. 8, 2002

Related U.S. Application Data

(63) Continuation-in-part of application No. 09/675,086, filed on Sep. 28, 2000.

(51) Int. Cl.[7] .............................. H05K 1/11; H01R 12/04
(52) U.S. Cl. ........................................ 174/262; 361/794
(58) Field of Search .............................. 174/262–266; 361/794, 795

(56) References Cited

U.S. PATENT DOCUMENTS

| 5,408,053 | A | * | 4/1995 | Young | 174/264 |
|---|---|---|---|---|---|
| 5,578,796 | A | * | 11/1996 | Bhatt et al. | 174/260 |
| 6,011,693 | A | * | 1/2000 | Gore | 361/760 |
| 6,054,652 | A | * | 4/2000 | Moriizumi et al. | 174/261 |
| 6,208,032 | B1 | * | 3/2001 | Yasuda et al. | 257/758 |
| 6,329,604 | B1 | * | 12/2001 | Koya | 174/255 |
| 6,351,389 | B1 | * | 2/2002 | Malladi | 361/760 |
| 6,392,160 | B1 | * | 5/2002 | Andry et al. | 174/261 |
| 6,407,930 | B1 | * | 6/2002 | Hsu | 361/784 |

* cited by examiner

*Primary Examiner*—David L. Talbott
*Assistant Examiner*—Jeremy Norris
(74) *Attorney, Agent, or Firm*—Beyer Weaver & Thomas, LLP

(57) ABSTRACT

An electronic module includes an interconnect module having a plurality of metal layers separated by a plurality of dielectric layers in a stacked structure with electronic components mounted on one surface of the module. The electronic components are selectively interconnected by drilling via holes completely through all dielectric layers with a conductive material such as solder in each via contacting metal layers to be interconnected and each metal layer which is not connected by a via having a metal pattern devoid of metal at the via location. For via connecting non-ground layers, there will be a patch of solder mask on the backside ground layer to electrically prevent this via from inadvertently connecting to ground.

10 Claims, 3 Drawing Sheets

2-Layer Module

MULTI-LAYER INTERCONNECT MODULE AND METHOD OF INTERCONNECTION

CROSS-REFERENCES TO RELATED APPLICATIONS

This patent application is a continuation-in-part of copending application Ser. No. 09/675,086 filed Sep. 28, 2000 for "Multi-Layer Interconnect Module and Method of Interconnection."

BACKGROUND OF THE INVENTION

This invention relates generally to multi-layer interconnects for electrical circuits, and more particularly the invention relates to the interconnection of layers for circuit applications.

Multi-layer interconnects are used in electrical circuit fabrication for the interconnection of circuit components. Typically, the interconnect module comprises a ceramic such as alumina or other dielectric laminate material such as FR4, Getek, and BT, for example. Depending on module size, the module can have two metal layers on opposing module surfaces or multiple metal layers such as four positioned on opposing outer module surfaces and between dielectric layers within the module. The metal layers, aluminum or gold plated refractory metal for example, can be selectively patterned and etched for specific interconnect functions.

In a multi-layer metal module for microwave applications, the top layer is usually a signal strip line, the second layer is a ground plane, the third layer is a signal strip line, and the fourth or bottom layer is a ground layer. FIG. 1 illustrates the conventional structure for interconnecting the various layers through use of via holes filled or lined with solder or other suitable metal. The module includes metal layers 1, 2, 3, and 4 and dielectric layers 11, 12, 13 which separate the metal layers. Circuit components 15, 16, and 17 are selectively interconnected by the metal layers. For example, via 20 interconnects metal layers 1 and 2 for grounding, via 21 interconnects metal layers 1 and 3 for signal connection, via 22 interconnects layers 2 and 4 for common ground, via 23 connects layer 3 and layer 4 as a signal pad to the outside, and via 24 interconnects layers 2, 3, and 4 for grounding. It will be noted blind via holes are used which do not extend through the entire structure but only through dielectric layers necessary to access the interconnected metal layers. This use of blind via holes increases manufacturing steps and costs in fabricating the electronic modules.

BRIEF SUMMARY OF THE INVENTION

In accordance with the present invention a multi-layer interconnect structure is provided in which all via holes extend through all layers of the module. Layers which are not to be interconnected by a via have a metal pattern in which metal is not present at the via location. Thus, via holes can be drilled through all layers of the module, and the vias will interconnect only the metal layers which have metal at the via location. Any metal layers in which the metal has been removed at the via location are not interconnected. Thus, blind via holes are not required, and this facilitates manufacturing processing and reduces costs.

The invention and objects and features thereof will be more readily apparent from the following detailed description and appended claims when taken with the drawing.

BRIEF DESCRIPTION OF THE DRAWINGS

Like elements in FIGS. 1–3 and in FIGS. 4–6 have the same reference numerals.

DETAILED DESCRIPTION OF THE INVENTION

Figure 1:
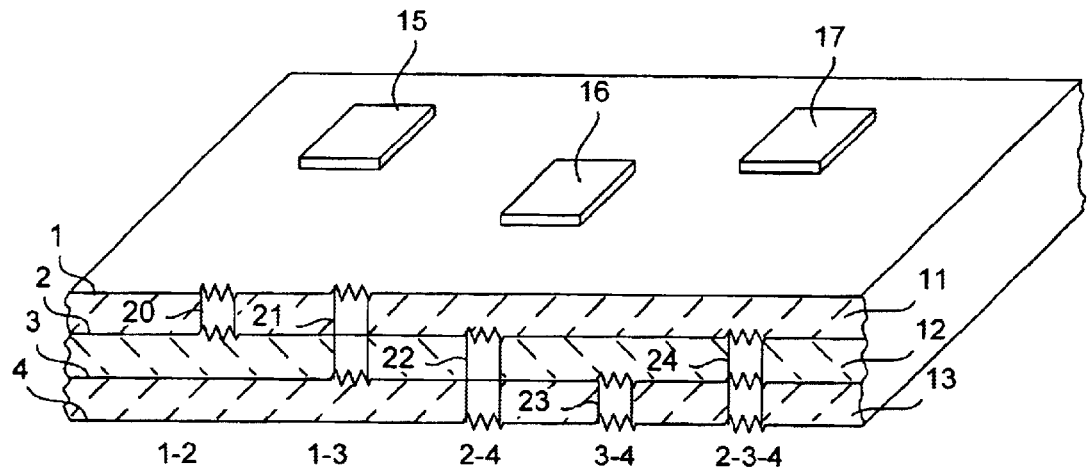
FIG. 1 is a perspective view in section illustrating a multi-layer interconnect module and interconnections of layers in accordance with the prior art.
Figure 2:
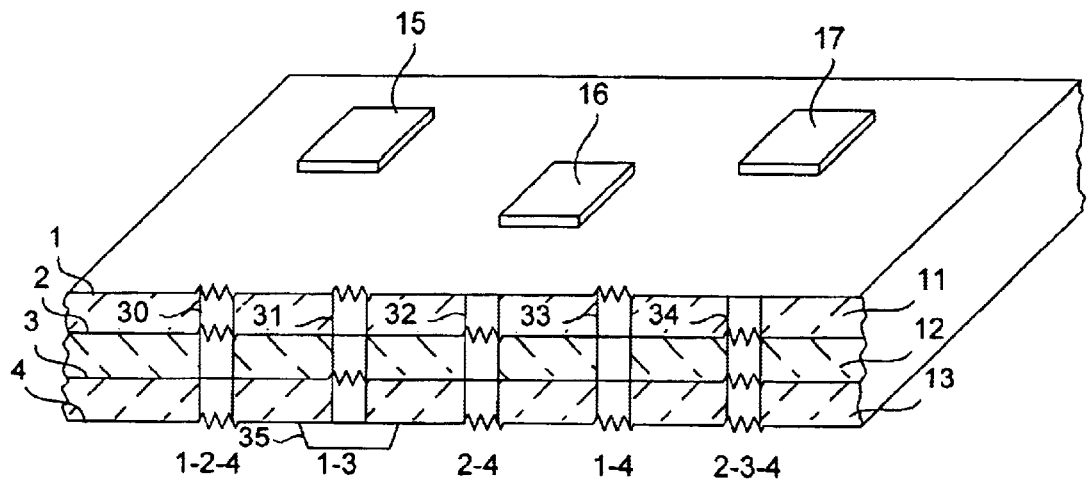
FIG. 2 is a perspective view in section illustrating a multi-layer interconnect module and interconnections of the layers of the module in accordance with one embodiment of the invention.

Referring to FIG. 2, a perspective view in section is illustrated of an interconnect module and method of interconnection of metal layers in accordance with an embodiment of the present invention. Again, metal layers 1, 2, 3 and 4 are separated by dielectric layers 11, 12, and 13 with electronic components 15, 16, 17 mounted on the top surface of the module. In accordance with the invention, interconnect vias 30, 31, 32, 33, 34 extend completely through all dielectric layers with conductive metal in each via contacting metal layers to be interconnected. Each metal layer which is not connected by a via has a metal pattern devoid of metal at the via location. Thus, via 30 selectively interconnects metal layers 1, 2, and 4; via 31 interconnect metal layers 1 and 3; via 32 selectively interconnects metal layers 2 and 4; via 33 selectively interconnects metal layer 1 and 4; and via 34 selectively interconnects metal layers 2, 3, and 4. Since the backside or bottom of the module will be soldered to a printed circuit board, any via not to be connected to the backside ground must be protected from solder by a solder mask, such as shown at 35 for via 31. Since via 31 interconnects layer 1 and layer 3 only as a signal line connection, a ground connection must be avoided.

Figure 3:
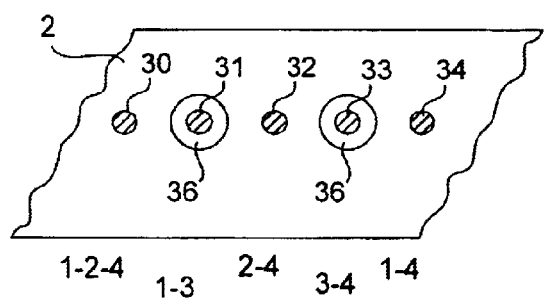
FIG. 3 is a plan view of metal layer 2 in FIG. 2.

FIG. 3 is a plan view of metal layer 2 showing the vias 30–34 extending through the metal layer. It will be noted where vias do not electrically contact metal layer 2, a pattern 36 around the via is devoid of metal whereby vias 31 and 33 do not make contact with metal layer 2. Again, it will be appreciated that metal layer 2 can be a printed circuit configuration or a continuous metal layer as required.

Even at RF frequencies, the thick solder mask 35 provides a very low capacitive coupling between the ground and the via hole. For a 2 mil thick solder mask, the capacitance to a 15 mil diameter via hole is less than 0.1 pF. This is negligible for a wireless communication application up to the 5 GHz range.

Figure 4:
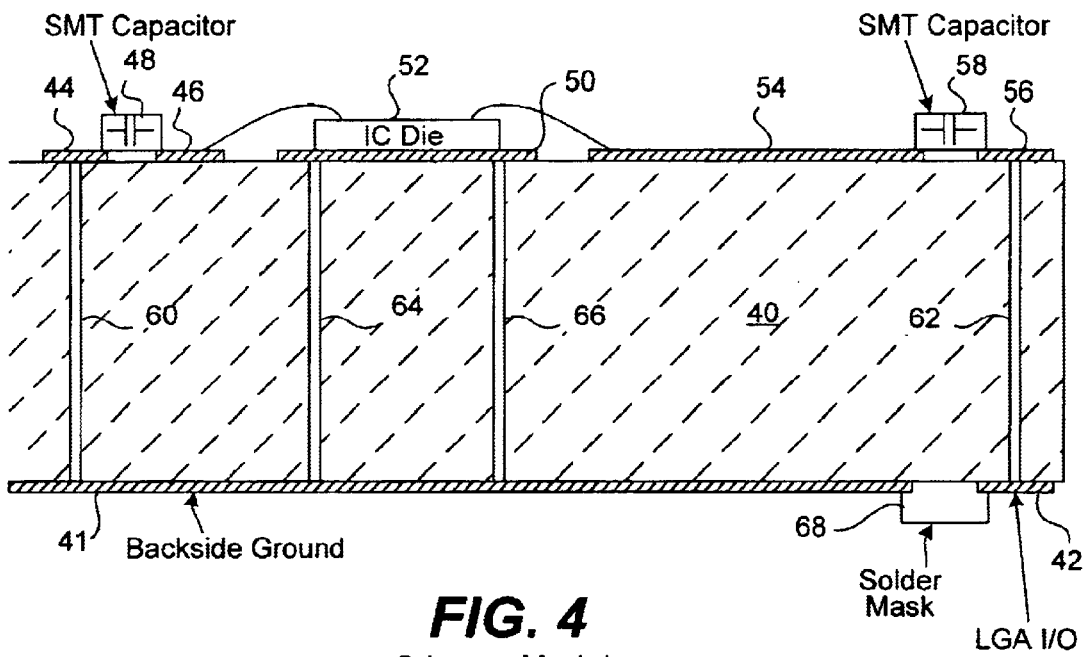
FIG. 4 is a section view of a conventional two-layer metal RF module.
Figure 5:
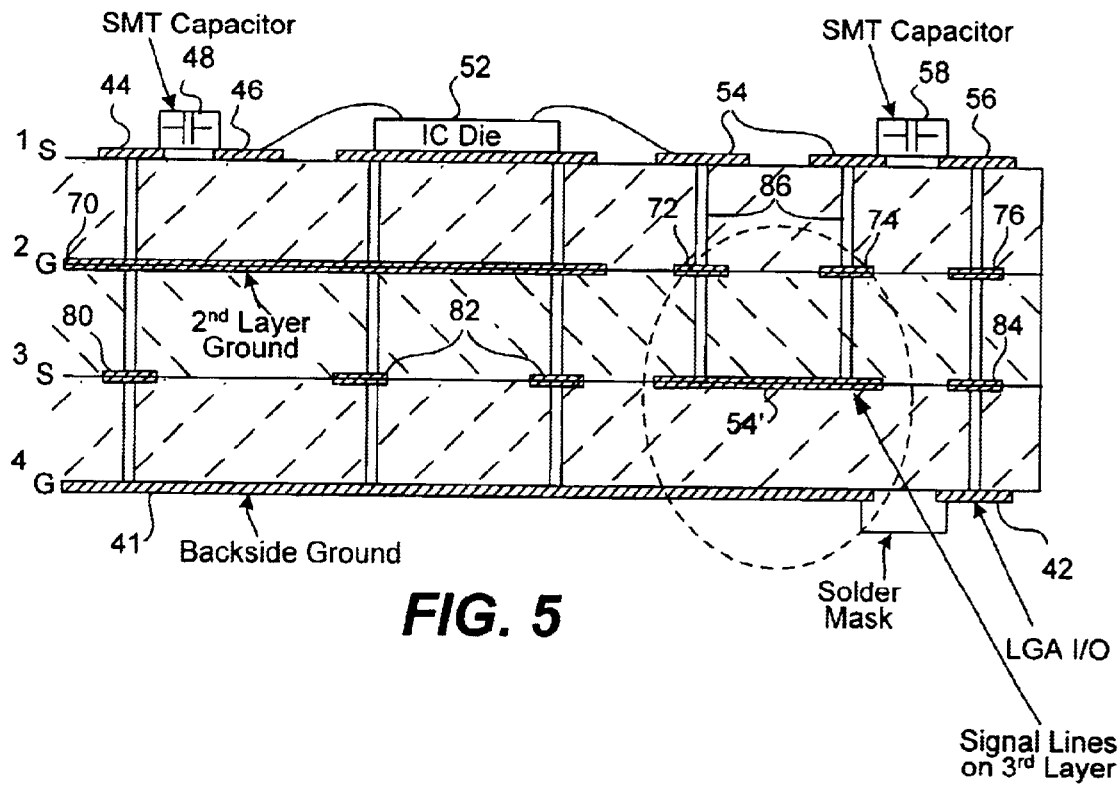
FIG. 5 and FIG. 6 are section views of the module of FIG. 4 as modified in accordance with the invention.
Figure 6:
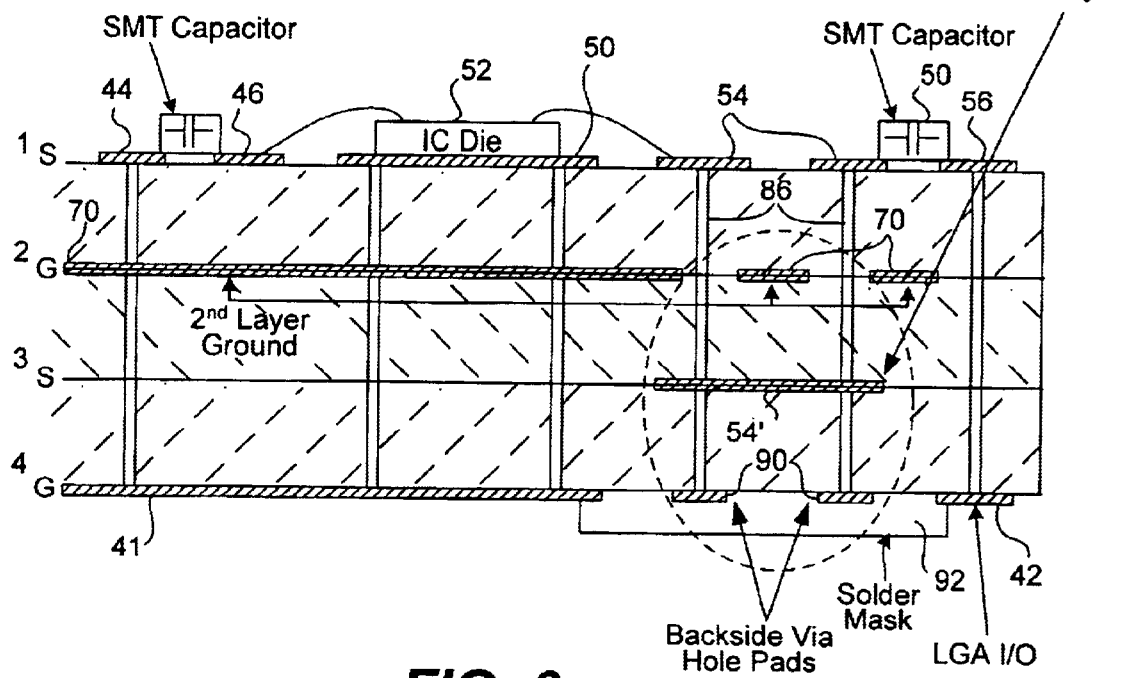

FIG. 4 is a section view of a conventional two-layer metal RF module, and FIGS. 5 and 6 are section views of the module of FIG. 4 as modified in accordance with another embodiment of the invention. In FIG. 4 a printed circuit board having a core material 40 has conductive metal layers on opposing surfaces including a backside ground plane 41 and an input/output (I/O) contact 42 on the backside and with the topside metal being selectively etched to form contacts 44 and 46 on which a surface mount capacitor 48 is mounted, metal layer 50 on which an IC die 52 is mounted, a trace layer 54 which forms a microstrip with ground plane 41, and another contact 56. An output capacitor 58 is mounted at one end of trace metal 54 and contact 56. IC die 52 is connected to contact 46 and to trace metal 54 by wire bonding, for example, and contact 44 and contact 56 are connected respectively through plated holes 60, 62 to backside ground plane 41 and to I/O contact 42. Metal layer 50 supporting IC die 52 is also connected to the backside ground plane 41 by plated through vias 64, 66. In completing the module, the front side is covered by molding compound and the module is then mounted to another printed circuit board by soldering of backside ground 41 and I/O contact 42 to the second printed circuit board. A solder mask 68 is provided to prevent shorting of I/O contact 42 and the ground plane.

As the size of the module is reduced, the metal trace 54 which forms a strip line with the backside ground becomes a limiting factor as a certain length of microstrip is required in the module. One way to achieve size reduction is by using a multi-metal (e.g. four layers) module and moving part of the microstrip trace 54 to an inner layer, as illustrated in FIG. 5. In this embodiment four metal layers (1, 2, 3, 4) are provided including the top metal and the bottom metal layer as in FIG. 4 and further including second and third intermediate layers with the second layer providing a ground plane 70 and intermediate contacts 72, 74, 76. The third metal layer includes intermediate contacts 80, 82, and 84 along with a metal trace portion 54' which is removed from the top metal layer and thus permits a shrinkage of the width of the module. Via conductors 86 connect contacts 54 on the top metal surface to the metal trace 54' in the third metal layer. Metal trace 54' and ground plane 41 form a microstrip.

In fabricating the module of FIG. 5 a core material is used between the top metal layer and the second metal layer, and a core metal layer is between the third metal layer and the bottom metal layer. Thus via holes can be drilled to connect layers one and two and to connect layers three and four. A bonding or prepreg layer is then added to bond the second and third layers with through holes then made between layers one and three. One could also use a core insulated layer between layers two and three and prepreg layers between layers one and two and between layers three and four. This approach results in a reduced size module, however, the cost of making a multi-layer board with blind via holes as in the prior art is high.

In order to ease manufacturing and reduce cost, in accordance with the invention the blind via holes are avoided as shown in FIG. 6. Where contact 72, 74 are located in the second metal layer, metal can be removed as described above with reference to FIG. 3 and as illustrated in FIG. 6 whereby via holes can be drilled from the top metal layer through to the bottom surface. Internal ground layer 70 and metal trace 54' now form the microstrip. A portion of bottom metal layer 41 is removed except for backside via hole pads 90, and a solder mask 92 is then applied over pads 90 to prevent shorting to ground plane 41 and output contact 42 when the module is soldered to a second supporting printed circuit board. Thus the through via holes 86 which connect signal line layer 1 and signal line layer 3 are spaced from the backside metal by a gap in the metal with solder mask 92 preventing shorting thereof. A very small capacitance results between pads 90 and the supporting PCB metal surface, but for a two mil thick solder mask layer and a fifteen mil diameter via hole pads, the capacitance value is about 0.1 pF which is negligible in the 5 GHz range and above. Thus utilizing the solder mask layer on the backside of the module to prevent shorting of the through via holes and the ground plane allows a simplified low-cost production of the multi-metal layer module.

The use of via holes extending through all dielectric layers while selectively interconnecting less than all of the metal layers of a multi-layer interconnect module facilitates manufacturing and thus reduces cost of the finished electronic module. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A multi-layer microwave interconnect module having a top surface and a bottom surface and comprising:

four metal layers separated by a plurality of dielectric layers including a top signal layer on the top surface, a bottom metal layer on the bottom surface, an internal around layer, and an internal signal layer, the top signal layer providing contacts for electrical components mounted on the module, the internal signal layer providing a metal trace for cooperating with the internal ground layer as a microstrip, and the bottom metal layer providing a bottom ground plane and at least one input/output contact, conductive vias selectively connecting at least one contact in the top signal layer to the bottom ground plane, at least one contact from the top signal layer to the at least one input/output contact, and contacts in the top signal layer to the metal trace in the internal signal layer, the conductive vias extending from the top surface to the bottom surface for ease in fabrication, the internal ground layer having a metal pattern devoid of metal at a location of a via not connected to the ground layer, and a solder mask overlying the bottom surface and the conductive vias selectively interconnecting contacts in the top surface to the metal trace in the internal signal layer.

2. The multi-layer microwave interconnect module as defined by claim 1 wherein the dielectric comprises alumina.

3. The multi-layer microwave interconnect module as defined by claim 1 wherein the dielectric layer is selected from the group consisting of FR4, Getek, and BT.

4. The multi-layer microwave interconnect module as defined by claim 1 wherein the metal layer comprises copper.

5. The multi-layer microwave interconnect module as defined by claim 1 wherein the metal layer comprises a gold plated refractory metal.

6. A microwave electronic module having a top surface and a bottom surface and comprising:

four metal layers separated by a plurality of dielectric layers with a top signal layer on the top surface, a bottom metal layer on the bottom surface, an internal around layer, and an internal signal layer, the top signal layer providing contacts for electrical components mounted on the module, the internal signal layer providing a metal trace for cooperating with the internal ground layer as a microstrip, and the bottom metal layer providing a bottom around plane and at least one input/output contact, a plurality of electronic components mounted on the top surface of the module, conductive vias selectively connecting at least one contact in the top signal line to the bottom ground plane, at least one contact in the ton signal layer to the at least one input/output contact, and contacts in the top signal layer to the metal trace in the internal signal layer, the conductive vias extending from the top surface to the bottom surface for ease in fabrication, the internal ground layer having a metal pattern devoid of metal where a via is not connected to the ground layer, and a solder mask overlying the bottom surface and the conductive vias selectively interconnecting contacts in the top surface to the metal trace in the internal signal layer.

7. The multi-layer microwave interconnect module as defined by claim 6 wherein the dielectric comprises alumina.

8. The multi-layer microwave interconnect module as defined by claim 6 wherein the dielectric layer is selected from the group consisting of FR4, Getek, and BT.

9. The multi-layer microwave interconnect module as defined by claim 6 wherein the metal layer comprises copper.

10. The multi-layer microwave interconnect module as defined by claim 6 wherein the metal layer comprises a gold plated refractory metal.

* * * * *